(12) United States Patent
Chang et al.

(10) Patent No.: US 11,283,412 B2
(45) Date of Patent: Mar. 22, 2022

(54) LOW NOISE AMPLIFIER CIRCUIT HAVING MULTIPLE GAINS

(71) Applicant: REALTEK SEMICONDUCTOR CORPORATION, Hsinchu (TW)

(72) Inventors: Chia-Jun Chang, Hsinchu (TW); Chia-Yi Lee, Hsinchu (TW); Ping-Hsuan Tsai, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 95 days.

(21) Appl. No.: 16/889,140

(22) Filed: Jun. 1, 2020

(65) Prior Publication Data

US 2021/0135632 A1    May 6, 2021

(30) Foreign Application Priority Data

Oct. 31, 2019 (TW) .................... 108139446

(51) Int. Cl.
*H03F 3/04* (2006.01)
*H03F 1/22* (2006.01)
*H03F 3/72* (2006.01)

(52) U.S. Cl.
CPC .............. *H03F 1/223* (2013.01); *H03F 3/72* (2013.01); *H03F 2200/294* (2013.01); *H03F 2200/84* (2013.01)

(58) Field of Classification Search
CPC ... H03F 1/22; H03F 1/223; H03F 3/72; H03F 2200/84; H03F 2200/294
USPC .......................................... 330/51, 288, 311
See application file for complete search history.

(56) References Cited

U.S. PATENT DOCUMENTS

| 7,135,894 B1 * | 11/2006 | Stegers ............ H03K 17/04106 327/108 |
| 9,350,310 B2 | 5/2016 | Youssef et al. |
| 9,774,303 B1 | 9/2017 | Ayranci et al. |

(Continued)

FOREIGN PATENT DOCUMENTS

WO    2008111491    6/2010

OTHER PUBLICATIONS

Taiwan Intellectual Property Office, Office Action letter of the counterpart TW application (appl. no. 108139446) dated Jan. 8, 2020.

(Continued)

*Primary Examiner* — Steven J Mottola
(74) *Attorney, Agent, or Firm* — WPAT, PC

(57) ABSTRACT

A low noise amplifier circuit includes an input stage circuit, a first output stage circuit, and a second output stage circuit. The input stage circuit is configured to receive an input signal and to generate a bias signal. The first output stage circuit corresponding to a first wireless communication and is configured to be biased according to the bias signal and a first control signal, in order to generate a first output signal, in which the first control signal is for setting a first gain of the first output stage circuit. The second output stage circuit corresponding to a second wireless communication and is configured to be biased according to the bias signal and a second control signal, in order to generate a second output signal, in which the second control signal is for setting a second gain of the second output stage circuit.

10 Claims, 3 Drawing Sheets

(56) References Cited

U.S. PATENT DOCUMENTS

2013/0043955 A1* 2/2013 Lee .................. H03F 3/189
　　　　　　　　　　　　　　　　　　　330/311

OTHER PUBLICATIONS

Taiwan Intellectual Property Office, Office Action letter of the counterpart TW application (appl. no. 108139446) dated May 6, 2020.

* cited by examiner

LOW NOISE AMPLIFIER CIRCUIT HAVING MULTIPLE GAINS

BACKGROUND OF THE INVENTION

1. Field of the Invention

The present disclosure relates to a receiver device, especially to a receiver device that has low noise amplifier circuits having multiple gains.

2. Description of Related Art

In order to receive multiple wireless signals having different input power simultaneously, a low noise amplifier (LNA) having a variable gain is utilized in a transceiver device. In current approaches, when a wireless signal having higher power is received, a gain of the LNA is decreased to prevent subsequent circuits from being saturated. As a result, other wireless signals having lower power cannot be properly amplified, and thus suffer from noises.

SUMMARY OF THE INVENTION

In some embodiments, a low noise amplifier (LNA) circuit includes an input stage circuit, a first output stage circuit, and a second output stage circuit. The input stage circuit is configured to receive an input signal and to generate a bias signal. The first output stage circuit corresponding to a first wireless communication and is configured to be biased according to the bias signal and a first control signal, in order to generate a first output signal, in which the first control signal is for setting a first gain of the first output stage circuit. The second output stage circuit corresponding to a second wireless communication and is configured to be biased according to the bias signal and a second control signal, in order to generate a second output signal, in which the second control signal is for setting a second gain of the second output stage circuit.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals. As used herein, the term "and/or" includes any and all combinations of one or more of the associated listed items.

Figure 1:
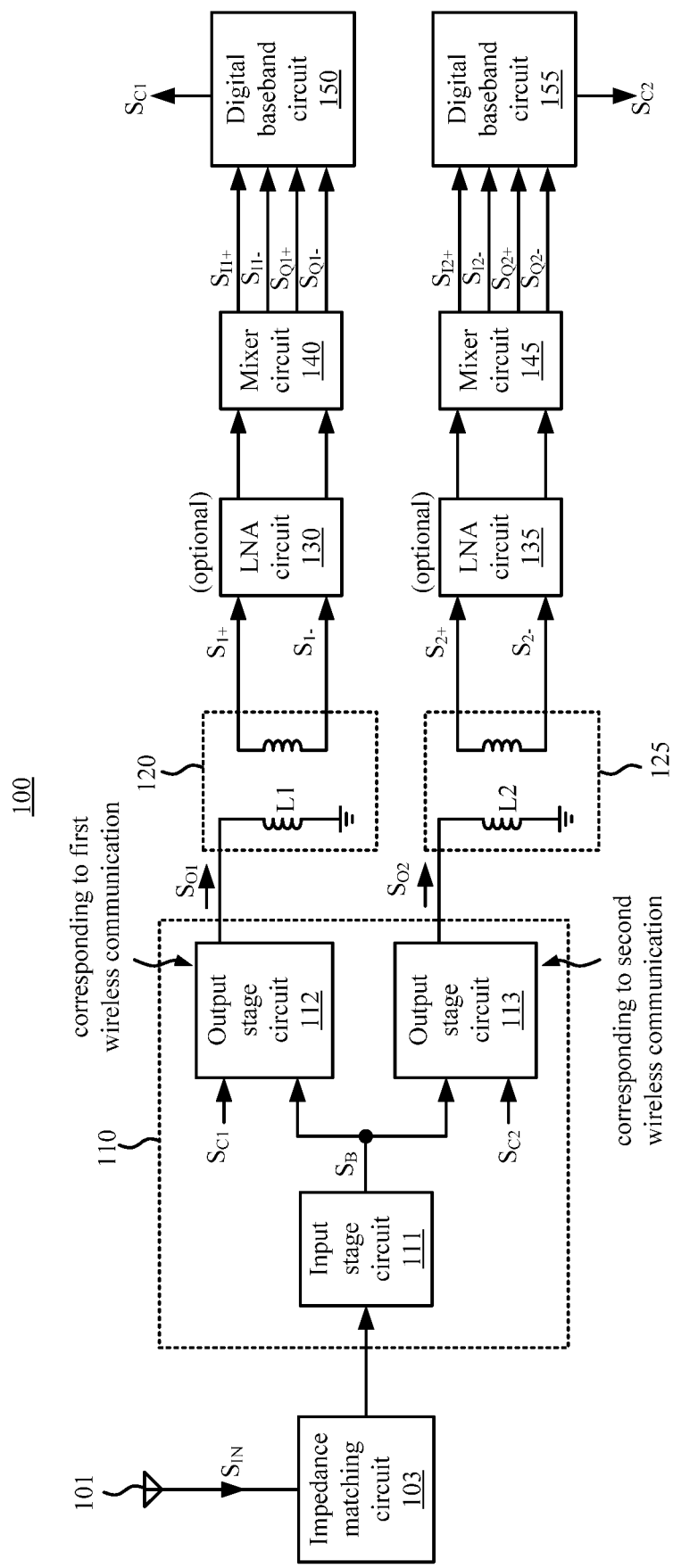
FIG. 1 illustrates a schematic diagram of a receiver device according to some embodiments of the present disclosure.

FIG. 1 illustrates a schematic diagram of a receiver device 100 according to some embodiments of the present disclosure. In some embodiments, the receiver device 100 may be applied with a wireless communication.

The receiver device 100 includes an antenna 101, an impedance matching circuit 103, a low noise amplifier (LNA) circuit 110, an isolation circuit 120, an isolation circuit 125, a mixer circuit 140, a mixer circuit 145, a digital baseband circuit 150, and a digital baseband circuit 155. The antenna 101 receives an input signal $S_{IN}$, and transmits the input signal $S_{IN}$ to the LNA circuit 110 via the impedance matching circuit 103.

The LNA circuit 110 is configured to generate a bias signal $S_B$ according to the input signal $S_{IN}$. The LNA circuit 110 generates an output signal $S_{O1}$ according to the bias signal $S_B$ and a control signal $S_{C1}$, and generates an output signal $S_{O2}$ according to the bias signal $S_B$ and a control signal $S_{C2}$. In some embodiments, the LNA circuit 110 includes an input stage circuit 111, an output stage circuit 112, and an output stage circuit 113. The input stage circuit 111 generates the bias signal $S_B$ according to the input signal $S_{IN}$. The output stage circuit 112 corresponds to a first wireless communication, and the output stage circuit 113 corresponds to a second wireless communication. For example, the first wireless communication may be (but not limited to) a wireless local area network (WLAN), and the output stage circuit 112 is configured to amplify a data signal transmitted via the WLAN. The second wireless communication may be (but not limited to) Bluetooth, and the output stage circuit 113 is configured to amplify a data signal transmitted through the Bluetooth.

The output stage circuit 112 is configured to be biased according to the bias signal $S_B$ and the control signal $S_{C1}$, in order to generate the output signal $S_{O1}$, in which the control signal $S_{C1}$ is for setting a gain of the output stage circuit 112. If the gain of the output stage circuit 112 is higher, power of the output signal $S_{O1}$ is higher. Similarly, the output stage circuit 113 is configured to be biased according to the bias signal $S_B$ and the control signal $S_{C2}$, in order to generate the output signal $S_{O2}$. The control signal $S_{C2}$ is for setting a gain of the output stage circuit 113. If the gain of the output stage circuit 113 is higher, power of the output signal $S_{O2}$ is higher. Operations herein are described in the following paragraphs with reference to FIG. 2 and FIG. 3.

In some embodiments, an inductor (e.g., an inductor L1 or an inductor L2) in each of the isolation circuit 120 and the isolation circuit 125 may be implemented with a coil or a winding. The isolation circuit 120 is coupled to the LNA circuit 110 to receive the output signal $S_{O1}$, and generates differential signals $S_{1+}$ and $S_{1-}$ and transmits the same to the mixer circuit 140. The isolation circuit 125 is coupled to the LNA circuit 110 to receive the output signal $S_{O2}$, and generates differential signals $S_{2+}$ and $S_{2-}$ and transmits the same to the mixer circuit 145. The mixer circuit 140 modulates the signals $S_{1+}$ and $S_{1-}$ to generate signals $S_{I1+}$, $S_{I1-}$, $S_{Q1+}$, and $S_{Q1-}$. The mixer circuit 145 modulates the signals $S_{2+}$ and $S_{2-}$ to generate signals $S_{I2+}$, $S_{I2-}$, $S_{Q2+}$, and $S_{Q2-}$. The digital baseband circuit 150 is able to analyze the power of the input signal $S_{IN}$ according to the signals $S_{I1+}$, $S_{I1-}$, $S_{Q1+}$, and $S_{Q1-}$, in order to generate the control signal $S_{C1}$. The digital baseband circuit 155 is able to analyze the power of the input signal $S_{IN}$ according to the signals $S_{I2+}$, $S_{I2-}$, $S_{Q2+}$, and $S_{Q2-}$, in order to generate the control signal $S_{C2}$.

For example, if the input signal $S_{IN}$ includes a data signal that corresponds to the first wireless communication, the digital baseband circuit 150 acquires this data signal according to the signals $S_{I1+}$, $S_{I1-}$, $S_{Q1+}$, and $S_{Q1-}$. According to bits of this data signal, the digital baseband circuit 150 determines whether to adjust the power of the data signal. For example, if a time interval when all bits of this data signal have logic values of 1 exceeds a predetermined time, the digital baseband circuit 150 determines that the power of this data signal is too high, and outputs the control signal $S_{C1}$ to lower the gain of the output stage circuit 112. Based on similar operations, the digital baseband circuit 155 also outputs the control signal $S_{C2}$ to adjust the gain of the output stage circuit 113. The above configurations of the digital baseband circuits 150 and 155 are given for illustrative purposes, and the present disclosure is not limited thereto.

In some embodiments, the receiver device 100 may further include a LNA circuit 130 and a LNA circuit 135. The LNA circuit 130 is coupled between the isolation circuit 120 and the mixer circuit 140, and is configured to provide an additional gain to amplify the signals $S_{1+}$ and $S_{1-}$. The LNA circuit 135 is coupled between the isolation circuit 125 and the mixer circuit 145, and is configured to provide an additional gain to amplify the signals $S_{2+}$ and $S_{2-}$. According to practical requirements, the LNA circuit 130 and the LNA circuit 135 can be selectively arranged.

In some related approaches, a LNA circuit is set to amplify multiple wireless signals simultaneously. When the LNA circuit processes a wireless signal having higher power, the gain of the LNA circuit is set to be lower, in order to prevent subsequent circuits from being saturated. As a result, other wireless signals having lower power cannot be properly amplified, and thus suffer higher impacts from noise(s). Compared with these approaches, in some embodiments of the present disclosure, when wireless signals having different power are received, the LNA circuit 110 is able to provide different gains to process these wireless signals, in order to solve such issues.

Figure 2:
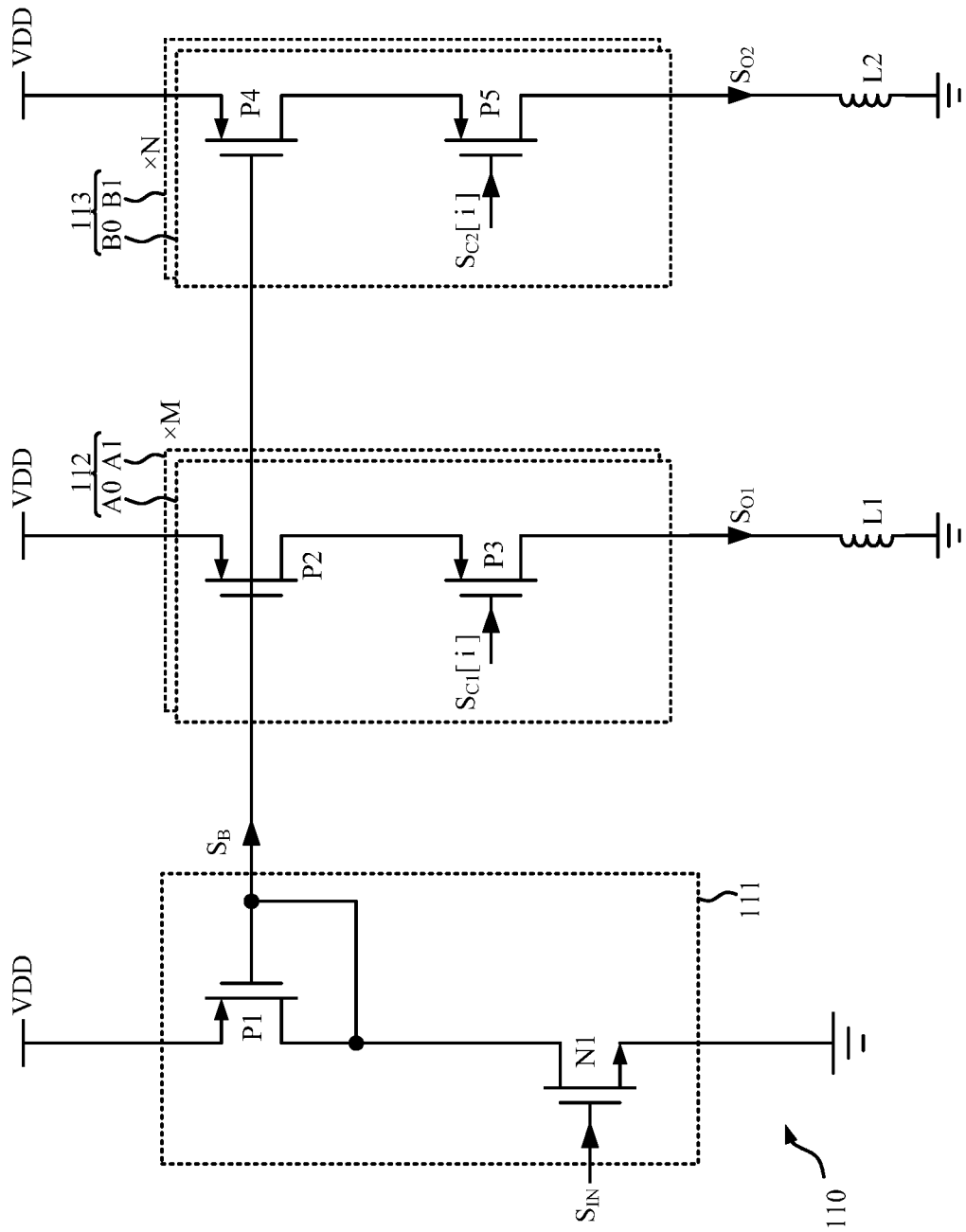
FIG. 2 is a circuit diagram of the LNA circuit in FIG. 1 according to some embodiments of the present disclosure.

FIG. 2 is a circuit diagram of the LNA circuit 110 in FIG. 1 according to some embodiments of the present disclosure. In this example, the input stage circuit 111, the output stage circuit 112, and the output stage circuit 113 operate as a current mirror circuit.

The input stage circuit 111 includes a transistor N1 and a transistor P1. A first terminal (e.g., source) of the transistor P1 is coupled to a power source to receive a voltage VDD, and a second terminal (e.g., drain) of the transistor P1 is coupled to a first terminal (e.g., drain) of the transistor N1 and a control terminal (e.g., gate) of the transistor P1, in order to generate the bias signal $S_B$. A second terminal (e.g., source) of the transistor N1 is coupled to ground, and a control terminal (e.g., gate) of the transistor N1 receives the input signal $S_{IN}$. The transistor N1 is configured to be turned on according to the input signal $S_{IN}$. The transistor P1 operates as a diode-connected transistor, in order to generate the bias signal $S_B$.

The output stage circuit 112 includes at least one current path (for example, M current path(s), in which M is a positive integer greater than or equal to one). The at least one current path is turned on according to the control signal $S_{C1}$ to generate the output signal $S_{O1}$. For example, as shown in FIG. 2, the output stage circuit 112 includes a current path A0 and a current path A1. The current path A0 and the current path A1 are coupled in parallel, and have the same circuit architecture. Taking the current path A0 as an example, the current path A0 includes a transistor P2 and a transistor P3. A first terminal of the transistor P2 receives the voltage VDD, a second terminal of the transistor P2 is coupled to a first terminal of the transistor P3, and a control terminal of the transistor P2 receives the bias signal $S_B$. A second terminal of the transistor P3 transmits the output signal $S_{O1}$ to the isolation circuit 120 (e.g., the inductor L1 in FIG. 1), and a control terminal of the transistor P3 receives a bit of the control signal $S_{C1}$ (labeled as $S_{C1}[i]$). The transistor P2 is biased by the bias signal $S_B$ to generate the output signal $S_{O1}$. The transistor P3 is configured to be turned on according to the bit $S_{C1}$ in order to output the output signal $S_{O1}$ to the isolation circuit 120.

As mentioned above, the current path A0 and the current path A1 are coupled in parallel, and thus the output signal $S_{O1}$ is a sum of the current flowing through the two current paths A0 and A1. The current path A0 is configured to be turned on according to a bit $S_{C1}[i]$ of the control signal $S_{C1}$, and the current path A1 is configured to be turned on according to another bit of the control signal $S_{C1}$ (e.g., $S_{C1}[i+1]$). When the current path A0 and the current path A1 are all turned on, the output signal $S_{O1}$ has a higher current value. Alternatively, if the current path A0 is turned on and the current path A1 is not turned on, the output signal $S_{O1}$ has a lower current value. In other words, if the gain of the output stage circuit 112 is higher, a number of path(s) being turned on by the control signal $S_{C1}$ in the at least current path is greater.

The output stage circuit 113 includes at least one current path (e.g., N current paths, in which N is a positive integer higher than or equal to 1, and N may be the same as or different from M). The at least one current path is turned on according to the control signal $S_{C2}$, in order to generate the output signal $S_{O2}$. For example, as shown in FIG. 2, the output stage circuit 113 includes a current path B0 and a current path B1. The current path B0 and the current path B1 are coupled in parallel, and have the same circuit architecture. Taking the current path B0 as an example, the current path B0 includes a transistor P4 and a transistor P5. A first terminal of the transistor P4 receives the voltage VDD, a second terminal of the transistor P4 is coupled a first terminal of the transistor P5, a control terminal of the transistor P4 is configured to receive the bias signal $S_B$. A second terminal of the transistor P5 is configured to transmit the output signal $S_{O2}$ to the isolation circuit 125 (e.g., the inductor L2 in FIG. 1), and a control terminal of the transistor P5 is configured to receive a bit of the control signal $S_{C2}$ (labeled as $S_{C2}[i+1]$). The transistor P4 is biased by the bias signal $S_B$, in order to generate the output signal $S_{O2}$. The transistor P5 is configured to be turned on according to the bit of the control signal $S_{C2}$, in order to output the output signal $S_{O2}$ to the isolation circuit 125.

Similarly, the output signal $S_{O2}$ is a sum of the current flowing through the two current paths B0 and B1. The current path B0 is configured to be turned on according to a bit of the control signal $S_{C2}$, and the current path B1 is configured to be turned on according to another bit of the control signal $S_{C2}$ (e.g., $S_{C2}[i+1]$). When the current path B0 and the current path B1 are all turned on, the output signal $S_{O2}$ has a higher current value. Alternatively, if the current path B0 is turned on and the current path B1 is not turned on, the output signal $S_{O2}$ has a lower current value. In other words, if the gain of the output stage circuit 113 is higher, a number of path(s) being turned on by the control signal $S_{C2}$ in the at least one current path is greater.

The number of the current paths shown in FIG. 2 is given for illustrative purposes, and the present disclosure is not limited thereto. In practical requirements, the number of the current paths is able to be adjusted correspondingly. Therefore, various numbers of the current paths are within the contemplated scope of the present disclosure.

Figure 3:
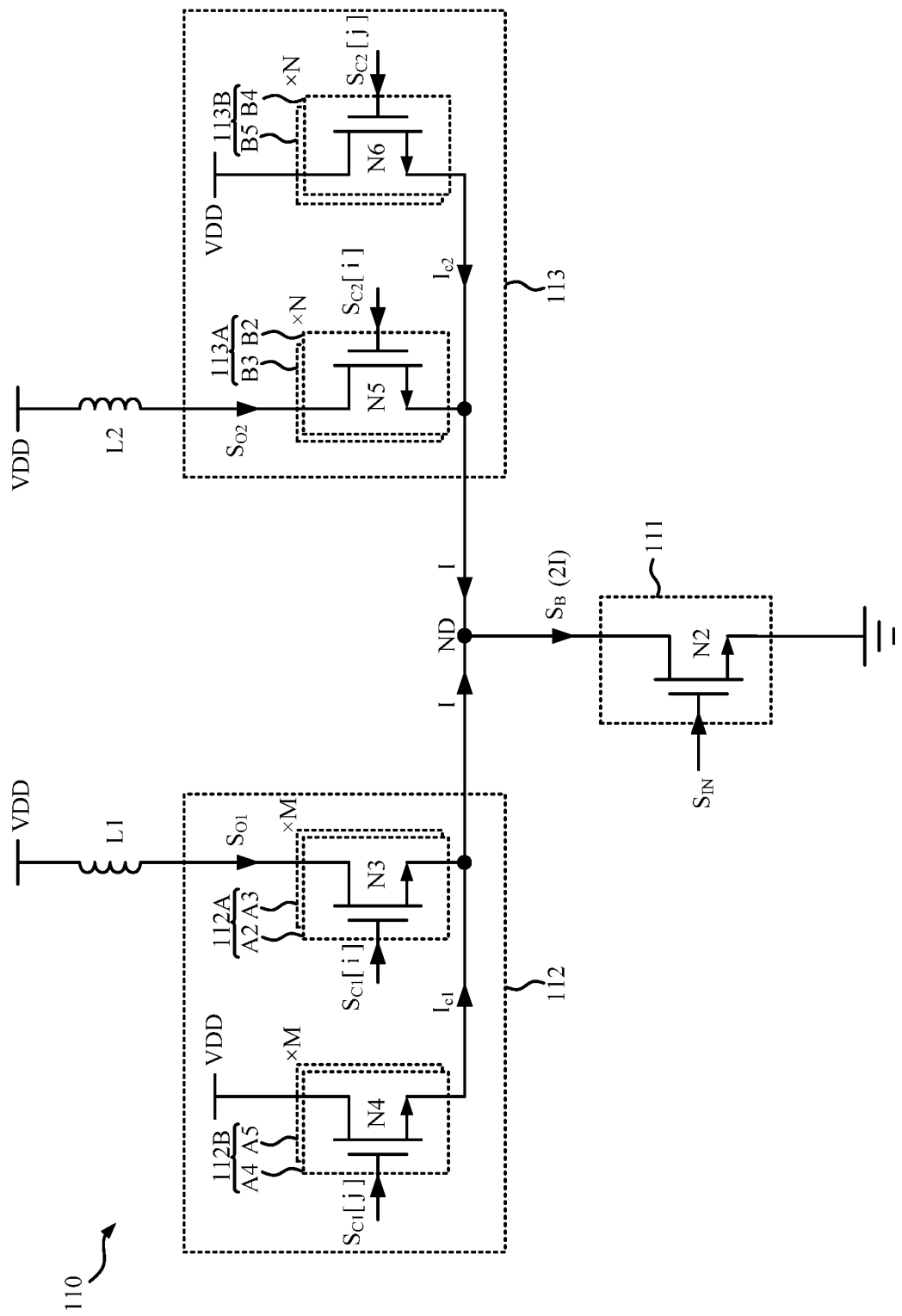
FIG. 3 is a schematic diagram of the LNA circuit in FIG. 1 according to some embodiments of the present disclosure.

FIG. 3 is a schematic diagram of the LNA circuit 110 in FIG. 1 according to some embodiments of the present disclosure. In this example, the input stage circuit 111, the output stage circuit 112, and the output stage circuit 113 operate as a current-steering circuit.

The input stage circuit 111 includes a transistor N2. A first terminal of the transistor N2 is coupled to a node ND, a second terminal of the transistor N2 is coupled to ground, and a control terminal of the transistor N2 receives the input signal $S_{IN}$. The transistor N2 is configured to generate (drain) the bias signal $S_B$ from the node ND according to the input signal $S_{IN}$.

The output stage circuit 112 is coupled to the node ND, in order to receive the bias signal $S_B$. The output stage circuit 112 includes an amplifier circuit 112A and a current adjustment circuit 112B. The amplifier circuit 112A is configured to generate the output signal $S_{O1}$ according to the bias signal $S_B$ and the control signal $S_{C1}$. In this example, the inductor L1 in FIG. 1 is coupled between a voltage source that provides the voltage VDD and the output stage circuit 112. The current adjustment circuit 112B is configured to adjust a current flowing through the amplifier circuit 112A (which may be equivalent to the output signal $S_{O1}$) according to the control signal $S_{C1}$, in order to set the gain of the output stage circuit 112.

For example, the amplifier circuit 112A includes at least one current path (e.g., M current paths) that is configured to be turned on according to at least one bit of the control signal $S_{C1}$ (labeled as $S_{C1}[i]$, in order to generate the output signal $S_{O1}$. The current adjustment circuit 112B includes at least one current path (e.g., M current paths) that is configured to be turned on according to at least one bit of the control signal $S_{C1}$ (labeled as $S_{C1}[j]$), in order to generate a current $I_{C1}$. The output signal $S_{O1}$ is a sum of the current flowing through path(s) being turned on in the amplifier circuit 112A, and the current $I_{C1}$ is a sum of the current flowing through path(s) being turned on in the current adjustment circuit 112B.

In some embodiments, different current paths in the amplifier circuit 112A may be turned on according to different bits of the control signal $S_{C1}$. For example, the current path A2 is turned on according to the bit $S_{C1}$ and the current path A3 is turned on according to the bit $S_{C1}[i+1]$. In some embodiments, different current paths in the current adjustment circuit 112B may be turned on according to different bits of the control signal $S_{C1}$. For example, the current path A4 is turned on according to the bit $S_{C1}$ and the current path A5 is turned on according to the bit $S_{C1}[j+1]$.

A sum of the current $I_{C1}$ and the output signal $S_{O1}$ is kept as a predetermined multiple of the bias signal $S_B$. In this example, the bias signal $S_B$ is 2I, and the sum of the current $I_{C1}$ and the output signal $S_{O1}$ is I (i.e., the predetermined multiple is 0.5). When a number of path(s) being turned on in the at least one current path of the amplifier circuit 112A is greater, a number of path(s) being turned on in the at least one current path of the current adjustment circuit 112B is fewer. Under this condition, the output signal $S_{O1}$ is higher, and the current $I_{C1}$ is lower. Alternatively, when the number of path(s) being turned on in the at least one current path of the amplifier circuit 112A is fewer, the number of path(s) being turned on in the at least one current path of the current adjustment circuit 112B is greater. Under this condition, the output signal $S_{O1}$ is lower, and the current $I_{C1}$ is higher. In some embodiments, the at least one bit $S_{C1}[i]$ is the inverse of the at least one bit $S_{C1}[i]$. With such configuration, the gain of the output stage circuit 112 is set according to the control signal $S_{C1}$.

For example, as shown in FIG. 3, the amplifier circuit 112A includes a current path A2 and a current path A3 that are coupled in parallel, and the current adjustment circuit 112B includes a current path A4 and a current path A5 that are coupled in parallel. When the current path A2 and the current path A3 are all turned on, the current path A4 and the current path A5 are turned off. Under this condition, the output signal $S_{O1}$ has a higher current value. Equivalently, the output stage circuit 112 has a higher gain. When the current path A2 is turned on, and when the current path A3 is turned off, the current path A4 is turned on, and the current path A5 is turned off. Under this condition, the output signal $S_{O1}$ has a lower current value. Equivalently, the output stage circuit 112 has a lower gain.

The current path A2 and the current path A3 are coupled in parallel, and are coupled between the inductor L1 and the node ND, and have the same circuit architecture. Taking the current path A2 as an example, the current path A2 includes a transistor N3. A first terminal of the transistor N3 is coupled to the inductor L1, a second terminal of the transistor N3 is coupled to the node ND, and a control terminal of the transistor N3 is configured to receive at least one bit of the control signal $S_{C1}$ (i.e., $S_{C1}$ [i]). When the transistor N3 is turned on in response to the bit $S_{C1}[i]$, the current path A2 generates the output signal $S_{O1}$.

Similarly, the current path A4 and the current path A5 are coupled in parallel and between the voltage source that provides the voltage VDD and the node ND, and have the same circuit architecture. Taking the current path A4 as an example, the current path A4 includes a transistor N4. A first terminal of the transistor N4 receives the voltage VDD, a second terminal of the transistor N4 is coupled to the node ND, and a control terminal of the transistor N4 is configured to receive at least one bit of the control signal $S_{C1}$ (i.e., $S_{C1}[j]$). When the transistor N4 is turned on in response to the bit $S_{C1}[j]$, the current path A4 generates the current $I_{C1}$.

The output stage circuit 113 is coupled to the node ND, in order to receive the bias signal $S_B$. The output stage circuit 113 includes an amplifier circuit 113A and a current adjustment circuit 113B. The amplifier circuit 113A is configured to generate the output signal $S_{O2}$ according to the bias signal $S_B$ and the control signal $S_{C2}$. In this example, the inductor L2 in FIG. 1 is coupled between the voltage source that provides the voltage VDD and the output stage circuit 113. The current adjustment circuit 113B is configured to adjust a current flowing through the amplifier circuit 113A (which may be equivalent to the output signal $S_{O2}$) according to the control signal $S_{C2}$, in order to set the gain of the output stage circuit 113.

For example, the amplifier circuit 113A includes at least one current path (e.g., N current path(s)) that is turned on according to at least one bit of the control signal $S_{C2}$ (labeled as $S_{C2}[i]$), in order to generate the output signal $S_{C2}$. The current adjustment circuit 113B includes at least one current path (e.g., N current path(s)) that is configured to be turned on according to at least one bit of the control signal $S_{C2}$ (labeled as $S_{C2}[j]$), in order to output a current $I_{C2}$. The output signal $S_{O2}$ is a sum of current flowing through current path(s) being turned on in the amplifier circuit 113A, and the current $I_{C2}$ is a sum of current flowing through path(s) being turned on in the current adjustment circuit 113B.

In some embodiments, different current paths in the amplifier circuit 113A may be turned on according to different bits of the control signal $S_{C2}$. For example, the current path B2 is turned on according to the bit $S_{C2}[i]$, and the current path B3 is turned on according to the bit $S_{C2}[i+1]$. In some embodiments, different current paths in the current adjustment circuit 113B may be turned on according to different bits of the control signal $S_{C2}$. For example, the current path B4 is turned on according to the bit $S_{C2}[j]$, and the current path B5 is turned on according to the bit $S_{C2}[j+1]$.

A sum of the current $I_{C2}$ and the output signal $S_{O2}$ is kept as a predetermined multiple of the bias signal $S_B$. In this example, the bias signal $S_B$ is set to be 2I, and a sum of the current $I_{C2}$ and the output signal $S_{O2}$ is set to be I (i.e., the predetermined multiple is 0.5). When the number of path(s) being turned on in the at least one current path of the amplifier circuit 113A is greater, the number of path(s) being turned on in the at least one current path of the current adjustment circuit 113B is less. Under this condition, the output signal $S_{O2}$ is higher and the current $I_{C2}$ is lower. Alternatively, when the number of path(s) being turned on in the at least one current path of the amplifier circuit 113A is less, the number of path(s) being turned on in the at least one current path of the current adjustment circuit 113B is greater. Under this condition, the output signal $S_{O2}$ is lower and the current $I_{C2}$ is higher. In some embodiments, the at least one bit $S_{C2}[i]$ is the inverse of the at least one bit $S_{C2}[j]$. With such configuration, the gain of the output stage circuit 113 is able to be set according to the control signal $S_{C2}$.

For example, as shown in FIG. 3, the amplifier circuit 113A includes a current path B2 and a current path B3 that are coupled in parallel, and the current adjustment circuit 113B includes a current path B4 and a current path B5 that are coupled in parallel. When the current path B2 and the current path B3 are all turned on, the current path B4 and the current path B5 are turned off. Under this condition, the output signal $S_{O2}$ has a higher current value. Equivalently, the output stage circuit 113 has a higher gain. When the current path B2 is turned on and the current path B3 is turned off, the current path B4 is turned on and the current path B5 is turned off. Under this condition, the output signal $S_{O2}$ has a lower current value. Equivalently, the output stage circuit 113 has a lower gain.

The current path B2 and the current path B3 are coupled in parallel and between the inductor L2 and the node ND, and have the same circuit architecture. Taking the current path B2 as an example, the current path B2 includes a transistor N5. A first terminal of the transistor N5 is coupled to the inductor L2, a second terminal of the transistor N5 is coupled to the node ND, and a control terminal of the transistor N5 is configured to receive at least one bit of the control signal $S_{C2}$ (i.e., $S_{C2}[i]$). When the transistor N5 is turned on in response to the bit $S_{C2}[i]$, the current path B2 generates the output signal $S_{O2}$.

Similarly, the current path B4 and the current path B5 are coupled in parallel and between the voltage source that provides the voltage VDD and the node ND, and have the same circuit architecture. Taking the current path B4 as an example, the current path B4 includes a transistor N6. A first terminal of the transistor N6 is coupled to the voltage source, a second terminal of the transistor N6 is coupled to the node ND, and a control terminal of the transistor N6 is configured to receive at least one bit of the control signal $S_{C2}$ (i.e., $S_{C2}[j]$). When the transistor N6 is turned on in response to the bit $S_{C2}[j]$, the current path B4 generates the current $I_{C2}$.

The number of the current paths shown in FIG. 3 is given for illustrative purposes, and the present disclosure is not limited thereto. According to different requirements, the number of the current paths is able to be adjusted correspondingly. Thus, various numbers of the current paths are within the contemplated scope of the present disclosure.

The above circuit configurations are given for illustrative purposes, and the present disclosure is not limited thereto. In some embodiments, the input stage circuit 111 may include multiple transistors that are turned on according to the input signal $S_{IN}$, in order to respectively provide multiple bias signals to the output stage circuit 112 and the output stage circuit 113.

Conductivity types of the transistors (e.g., P-type or N-type) and components of the transistors (e.g., MOSFET) shown in FIG. 2 and FIG. 3 are given for illustrative purposes, and the present disclosure is not limited thereto. Various types or components able to implement the same operations of the LNA circuit 110 are within the contemplated scope of the present disclosure.

As described above, the LNA circuit which provides multiple gains to process multiple wireless signals having different power is utilized in the receiver device provided in some embodiments of the present disclosure. As a result, when receiving multiple wireless signals, these wireless signals are ensured to be amplified properly, such that impacts from noises can be reduced.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:
1. A low noise amplifier (LNA) circuit, comprising:
an input stage circuit configured to receive an input signal and to generate a bias signal;
a first output stage circuit corresponding to a first wireless communication and being configured to be biased according to the bias signal and a first control signal, in order to generate a first output signal, wherein the first control signal is for setting a first gain of the first output stage circuit; and a second output stage circuit corresponding to a second wireless communication and being configured to be biased according to the bias signal and a second control signal, in order to generate a second output signal, wherein the second control signal is for setting a second gain of the second output stage circuit, the first gain is independent to the second gain, and the input stage circuit, the first output stage circuit, and the second output stage are configured to operate as a current mirror circuit.

2. The LNA circuit of claim 1, wherein the input stage circuit comprises:
   a first transistor configured to be turned on according to the input signal; and
   a second transistor coupled between a voltage source and the first transistor and configured to operate as a diode-connected transistor to generate the bias signal.

3. The LNA circuit of claim 1, wherein the first output stage circuit comprises at least one current path, the at least one current path is configured to be turned on according to the first control signal, in order to generate the first output signal, and each of the at least one current path comprises:
   a third transistor configured to be biased by the bias signal, in order to generate the first output signal; and
   a fourth transistor coupled to the third transistor, and configured to be turned on according to the first control signal, in order to output the first output signal.

4. The LNA circuit of claim 3, wherein if the first gain is higher, a number of paths being turned on in the at least one current path is greater.

5. The LNA circuit of claim 2, wherein a first terminal of the first transistor is coupled to the second transistor, a second terminal of the first transistor is coupled to ground, and a control terminal of the first transistor is configured to receive the input signal.

6. The LNA circuit of claim 5, wherein a first terminal of the second transistor is coupled to the voltage source, a second terminal of the second transistor is coupled to the first terminal of the first transistor, and a control terminal of the second transistor is coupled to the second terminal of the second transistor and is configured to generate the bias signal.

7. The LNA circuit of claim 3, wherein the at least one current path is coupled in parallel with each other.

8. The LNA circuit of claim 3, wherein a first terminal of the third transistor is configured to receive a voltage, a second terminal of the third transistor is configured to generate the first output signal, a control terminal of the third transistor is configured to receive the bias signal, a first terminal of the fourth transistor is coupled to the second terminal of the third transistor to receive the first output signal, a second terminal of the fourth transistor is configured to output the first output signal, and a control terminal of the fourth transistor is configured to receive a bit of the first control signal.

9. The LNA circuit of claim 8, wherein the second terminal of the fourth transistor is coupled to an isolation circuit.

10. The LNA circuit of claim 1, wherein the first output stage circuit is configured to output the first output signal to a first isolation circuit, and the second output stage circuit is configured to output the second output signal to a second isolation circuit.

* * * * *